United States Patent
Lee et al.

(10) Patent No.: US 9,164,398 B2
(45) Date of Patent: Oct. 20, 2015

(54) OVERLAY METROLOGY METHOD

(71) Applicant: TAIWAN SEMICONDUCTOR MANUFACTURING CO., LTD., Hsinchu (TW)

(72) Inventors: Yung-Yao Lee, Zhubei (TW); Ying-Ying Wang, Xin-Zhu (TW); Yi-Ping Hsieh, Hsinchu (TW); Heng-Hsin Liu, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/252,612

(22) Filed: Apr. 14, 2014

(65) Prior Publication Data

US 2014/0240706 A1 Aug. 28, 2014

Related U.S. Application Data

(63) Continuation-in-part of application No. 13/778,386, filed on Feb. 27, 2013.

(51) Int. Cl.
*G03F 7/20* (2006.01)
*G01B 11/14* (2006.01)

(52) U.S. Cl.
CPC ............ *G03F 7/70633* (2013.01); *G01B 11/14* (2013.01); *G01B 2210/56* (2013.01)

(58) Field of Classification Search
None
See application file for complete search history.

(56) References Cited

U.S. PATENT DOCUMENTS

| | | | |
|---|---|---|---|
| 6,975,974 B2 | 12/2005 | Chien et al. | |
| 7,962,302 B2* | 6/2011 | Baseman et al. | 702/82 |
| 8,095,484 B2* | 1/2012 | Cheng et al. | 706/14 |
| 2004/0101984 A1* | 5/2004 | Heine et al. | 438/16 |
| 2005/0240895 A1* | 10/2005 | Smith et al. | 716/19 |
| 2006/0271225 A1* | 11/2006 | Schulze et al. | 700/108 |
| 2007/0100487 A1* | 5/2007 | Cheng et al. | 700/108 |
| 2007/0185684 A1* | 8/2007 | Vuong et al. | 702/182 |
| 2007/0239383 A1* | 10/2007 | Funk et al. | 702/107 |
| 2007/0282767 A1* | 12/2007 | Cheng et al. | 706/15 |
| 2008/0228435 A1 | 9/2008 | Lee et al. | |
| 2008/0294280 A1* | 11/2008 | Okita | 700/108 |
| 2008/0306625 A1* | 12/2008 | Cheng et al. | 700/145 |
| 2009/0319214 A1* | 12/2009 | Tian et al. | 702/82 |
| 2010/0312374 A1* | 12/2010 | Tsai et al. | 700/110 |
| 2011/0190917 A1* | 8/2011 | Moyne | 700/103 |
| 2011/0251707 A1* | 10/2011 | Cheng et al. | 700/100 |
| 2011/0320025 A1* | 12/2011 | Heo et al. | 700/98 |
| 2012/0029662 A1* | 2/2012 | Cheng et al. | 700/29 |
| 2013/0259358 A1* | 10/2013 | Chen et al. | 382/149 |
| 2014/0031968 A1* | 1/2014 | Baseman et al. | 700/121 |

(Continued)

FOREIGN PATENT DOCUMENTS

TW 563042 B 11/2003

*Primary Examiner* — Gordon J Stock, Jr.
(74) *Attorney, Agent, or Firm* — Maschoff Brennan

(57) ABSTRACT

A process of measuring overlay metrologies of wafers, the wafer having a plurality of patterned layers. The process begins with retrieving historical overlay metrologies from a database, and real overlay metrologies of a first group of the wafers are measured. On the other hand, virtual overlay metrologies of a second group of the wafers are calculated with the retrieved historical overly metrologies. The real overlay metrologies of the first group of the wafers and the virtual overlay metrologies of the second group of the wafers are stored to the database as the historical overlay metrologies.

20 Claims, 6 Drawing Sheets

(56) References Cited

U.S. PATENT DOCUMENTS

| | | | |
|---|---|---|---|
| 2014/0031969 A1* | 1/2014 | Baseman et al. | 700/121 |
| 2014/0107828 A1* | 4/2014 | Zhu et al. | 700/121 |
| 2014/0241610 A1* | 8/2014 | Duffy et al. | 382/149 |

* cited by examiner

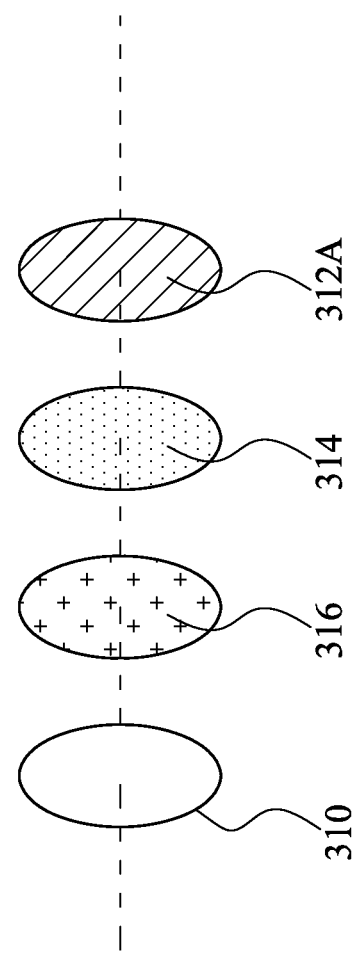

OVERLAY METROLOGY METHOD

PRIORITY CLAIM AND CROSS-REFERENCE

The present application is a continuation-in-part application of U.S. application Ser. No. 13/778,386 filed on Feb. 27, 2013. The entire disclosures of the above applications are hereby incorporated by reference herein.

BACKGROUND

The semiconductor integrated circuit industry has experienced exponential growth. In the evolution of the integrated circuit industry, functional density generally increased with reduced geometry size, and smaller and more complex circuits than the previous generation are produced. This scaling down process increases production efficiency and reduces manufacturing costs, but also complicates the manufacturing integrated circuits.

The integrated circuits are normally made through multiple process steps in a semiconductor wafer fabrication facility, where each process step places a patterned layer on a wafer. On the purpose to operate device correctly, these patterned layers must be aligned accurately with each other. Misalignment between the patterned layers may cause short circuits or connection failure, which significantly impact device yield.

Misalignment measurement between patterned layers, i.e. overlay metrology, on the wafer is one of the most important processes in the manufacturing integrated circuit devices. In particular, overlay metrology refers to the determination of the alignment accuracy of one patterned layer aligns with respect to another patterned layer next to it. With the increase in complexity of integrated circuits, the measurement of the overlay metrology becomes more and more important and difficult.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is an exploded view of a wafer with some embodiments.

DETAILED DESCRIPTION

Figure 1:
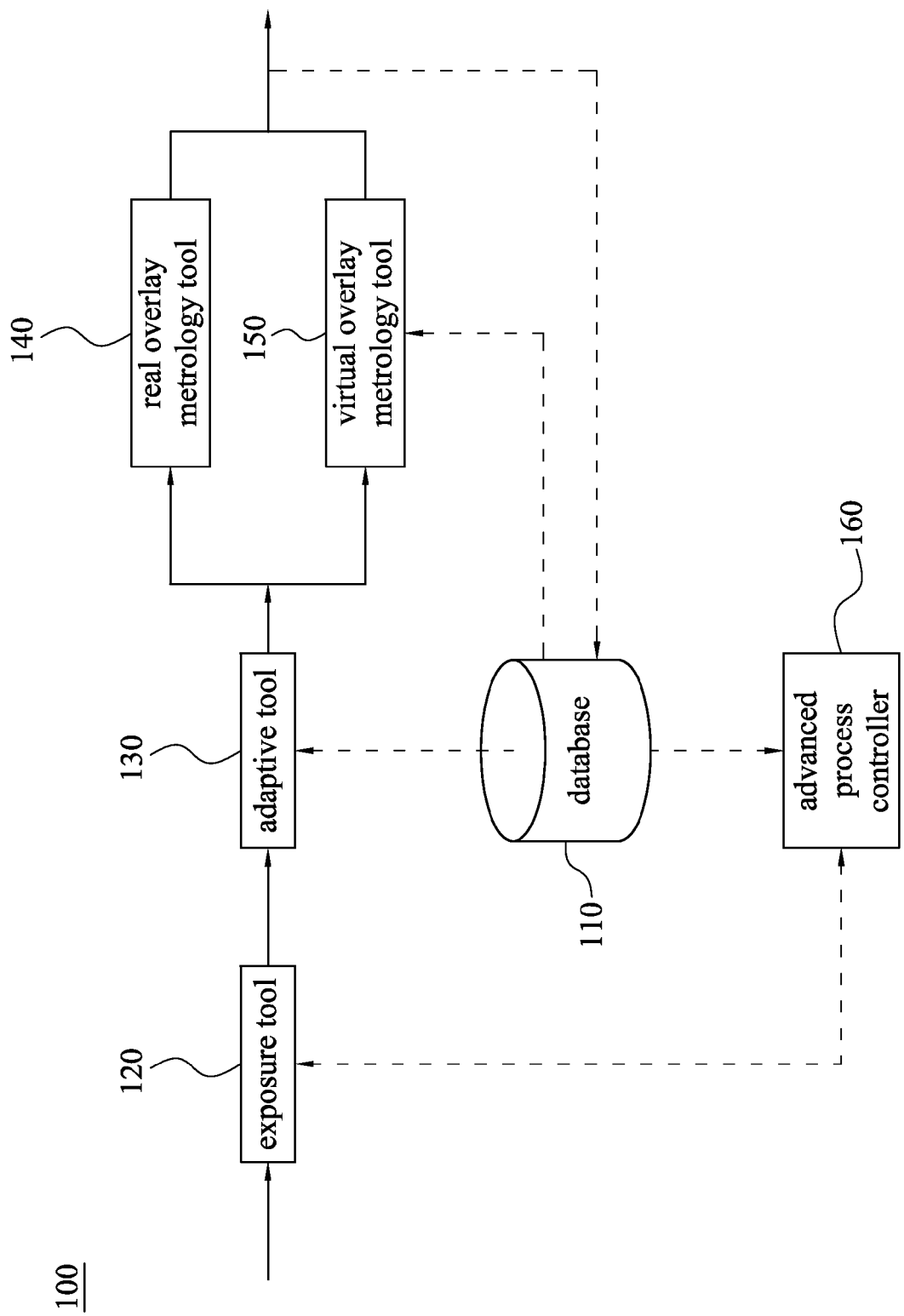
FIG. 1 is an apparatus of measuring overlay metrologies of wafers in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Generally, a real measurement is applied to measure misalignment between patterned layers on a wafer, which also known as an overlay metrology. But applying the real measurement to all wafers causes heavy loading for system capacity, and thus a calculation of the overlay metrology is necessary to provide reliable virtual overlay metrology and partially replaced the real overlay metrology to release the loading of the system. The present disclosure provides a mechanism for calculating the virtual overlay metrology to reduce the loading on the overlay metrology capacity.

FIG. 1 is an apparatus for measuring overlay metrologies of wafers according to various embodiments of the present disclosure, each of the wafers having a plurality of patterned layers. A wafer overlay metrology measurement apparatus 100 includes a database 110, an exposure tool 120, an adaptive tool 130, a real overlay metrology tool 140, and a virtual overlay metrology tool 150. Solid lines in FIG. 1 represent processing routes of the wafers, and dash lines represent routes of delivering data.

As shown in FIG. 1, the overlay metrologies of the wafers are known by the real overlay metrology tool 140 and the virtual overlay metrology tool 150, these overlay metrologies are stored in the database 110 as historical overlay metrologies. The historical overlay metrologies in the database 110 are retrievable as feedback information to augment a run-to-run control capability from a lot-to-lot or wafer-to-wafer control.

In the exposure tool 120, the patterned layers are formed on the wafers with an overlay recipe, and the patterned layer is different from each other on the wafer.

The overlay recipe in the exposure tool 120 includes an inter-field parameter and an intra-field parameter. The inter-field parameter includes an x-translation wafer parameter, a y-translation wafer parameter, an x-expansion wafer parameter, a y-expansion wafer parameter, an x-rotation wafer parameter, and a y-rotation wafer parameter, and the intra-field parameter includes an x-translation field parameter, a y-translation field parameter, an x-expansion field parameter, a y-expansion field parameter, an x-rotation field parameter, and a y-rotation field parameter.

The apparatus 100 also includes an advanced process controller 160 retrieves the overlay recipe from the exposure tool 120 and the historical overlay metrologies from the database 110. The advanced process controller 160 determines overlay parameters in the overlay recipe with the historical overlay metrologies and provides the overlay recipe back to the exposure tool 120.

After forming the patterned layers on the wafers in the exposure tool 120, the adaptive tool 130 retrieves the historical overlay metrologies from the database 110 and allocates a first group of the wafers to the real overlay metrology tool 140 and a second group of the wafers to the virtual overlay metrology tool 150. The adaptive tool 130 decides values of the first group and the second group with stability of the historical overlay metrologies.

The real overlay metrology tool 140 measures real overlay metrologies of the first group of the wafers, and the virtual overlay metrology tool 150 calculates virtual overlay metrologies of the second group of the wafers with the historical overlay metrologies from the database 110. With applying the virtual overlay metrology tool 150, capacity loading of the real overlay metrology tool 140 decreases significantly.

With connecting to the database 110, the measured real overlay metrologies in the real overlay metrology tool 140 and the calculated virtual overlay metrologies in the virtual overlay metrology tool 150 are both stored into the database 110 as the historical overlay metrologies.

Figure 2:
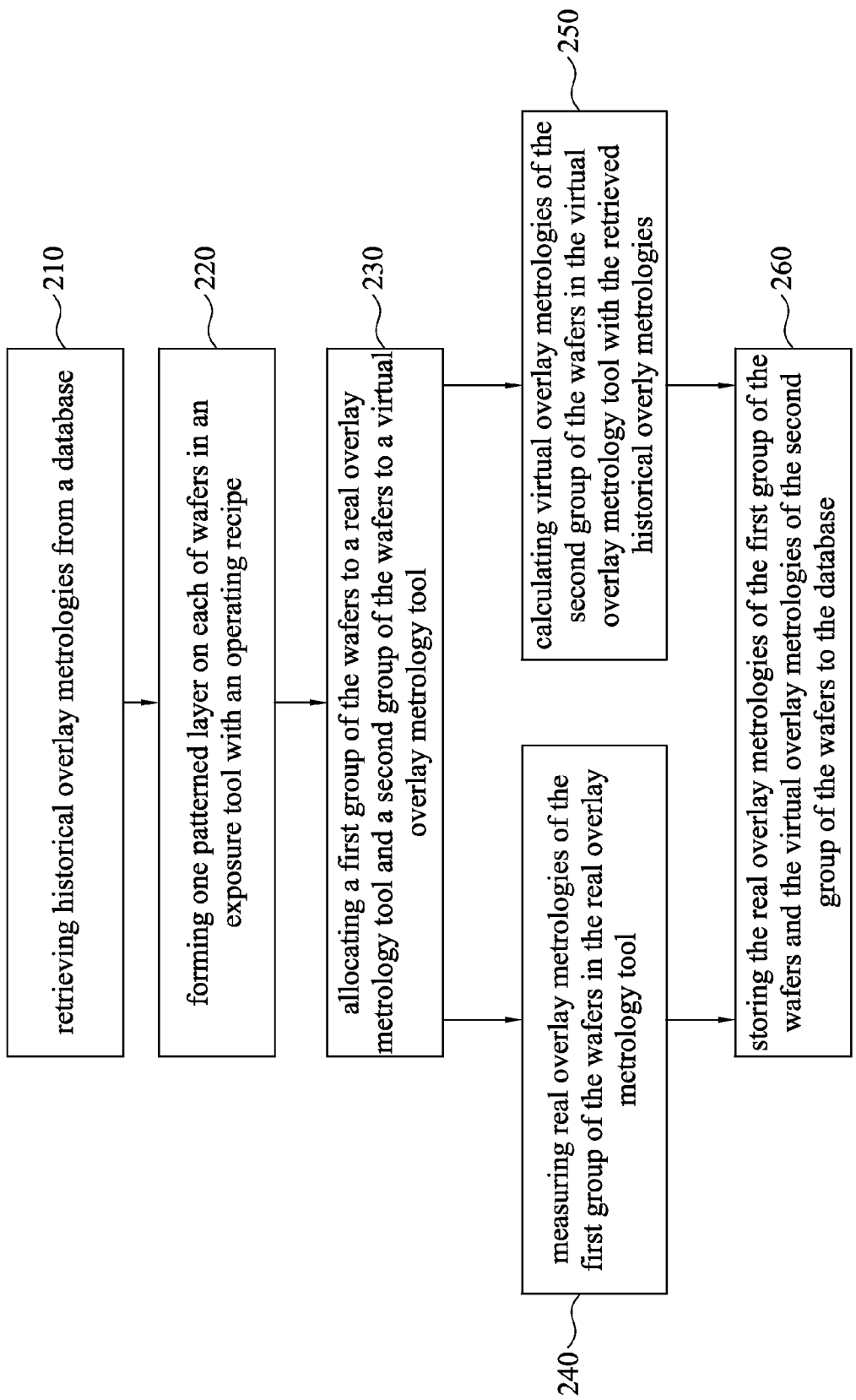
FIG. 2 is a process of measuring overlay metrologies of wafers in accordance with some embodiments.

FIG. 2 is a process of measuring the overlay metrologies of the wafers according to various embodiments of the present disclosure. The overlay metrologies measurement process is provided in a flow chart of FIG. 2, which is carried out by the apparatus 100 in FIG. 1.

The overlay metrologies measurement process begins with operation 210, the historical overlay metrologies are retrieved from the database 110. The overlay metrologies of the patterned layers on the wafers are already stored into the database 110 as the historical overlay metrologies, which are applicable for following operation.

Figure 3:
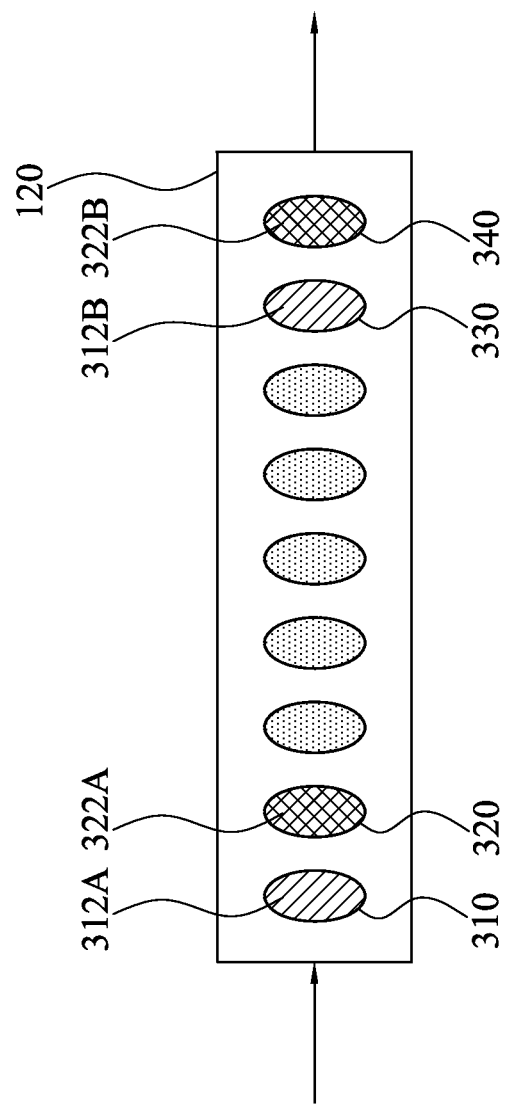
FIG. 3 is a diagrammatic view of forming patterned layers on wafers in an exposure tool in accordance with some embodiments.

Continuing to operation 220, one patterned layer is formed on each of the wafers in the exposure tool 120 with the overlay recipe. Referring to FIG. 3 to further clarify operation 220. FIG. 3 is a diagrammatic view of forming the patterned layers on the wafers in the exposure tool 120. As shown in FIG. 3, a different type of the patterned layers is formed on each of the wafers respectively in the exposure tool 120. Overlay metrologies of these patterned layers formed on the wafers in the exposure tool 120 are necessary to be measured or calculated.

Referring to operation 230, the first group of the wafers is allocated to the real overlay metrology tool 140 and the second group of the wafers is allocated to the virtual overlay metrology tool 150. The adaptive tool 130 analyzes the historical overlay metrologies from the database 110 to determine the values of the first group and the second group.

Referring to operation 240, the real overlay metrologies of the first group of the wafers are measured in the real overlay metrology tool 140. On the other hand, operation 250 is applied to calculate the virtual overlay metrologies of the second group of the wafers in the virtual overlay metrology tool 150 with the retrieved historical overlay metrologies.

Continuing to operation 260, the real overlay metrologies of the first group of the wafers and the virtual overlay metrologies of the second group of the wafers are stored to the database 110. The real overlay metrologies of the first group of the wafers and the virtual overlay metrologies of the second group of the wafers are stored to the database 110 as the historical overlay metrologies, and these historical overlay metrologies are applicable as feedback information in next run of process.

Figure 4:
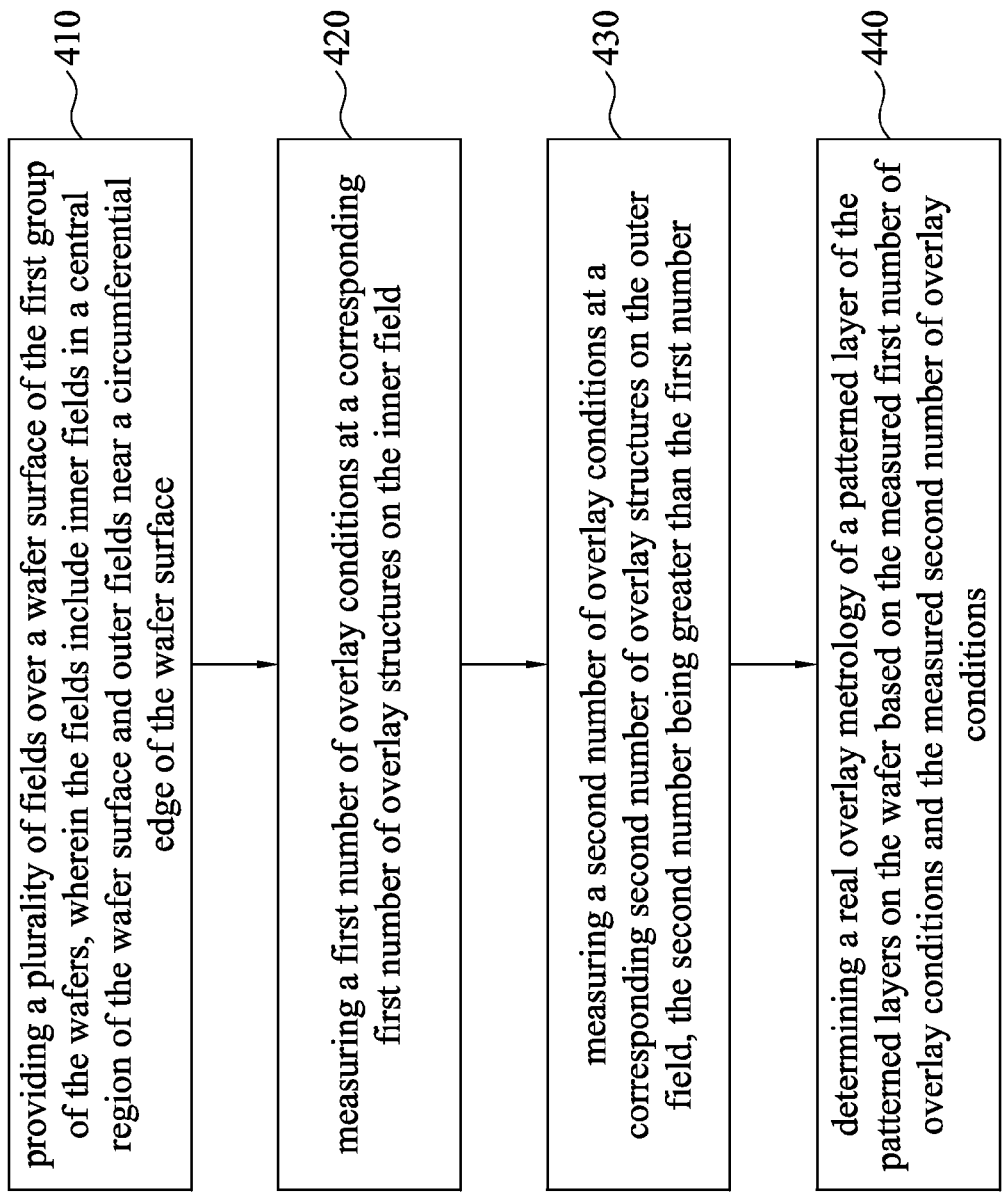
FIG. 4 is a process of measuring real overlay metrologies of a first group of wafers with some embodiments.

FIG. 4 is a process of measuring real overlay metrologies of the first group of the wafers. Referring to FIG. 4 to further clarify operation 240, which starts with operation 410, a plurality of fields is provided over a wafer surface of the first group of the wafers, wherein the fields include inner fields in a central region of the wafer surface and outer fields near a circumferential edge of the wafer surface.

Referring to operation 420, a first number of overlay conditions is measured at a corresponding first number of overlay structures on the inner field.

Continuing to operation 430, a second number of overlay conditions is measured at a corresponding second number of overlay structures on the outer field, the second number being greater than the first number.

Referring to operation 440, a real overlay metrology of a patterned layer of the patterned layers on the wafer is determined based on the measured first number of overlay conditions and the measured second number of overlay conditions.

Figure 5:
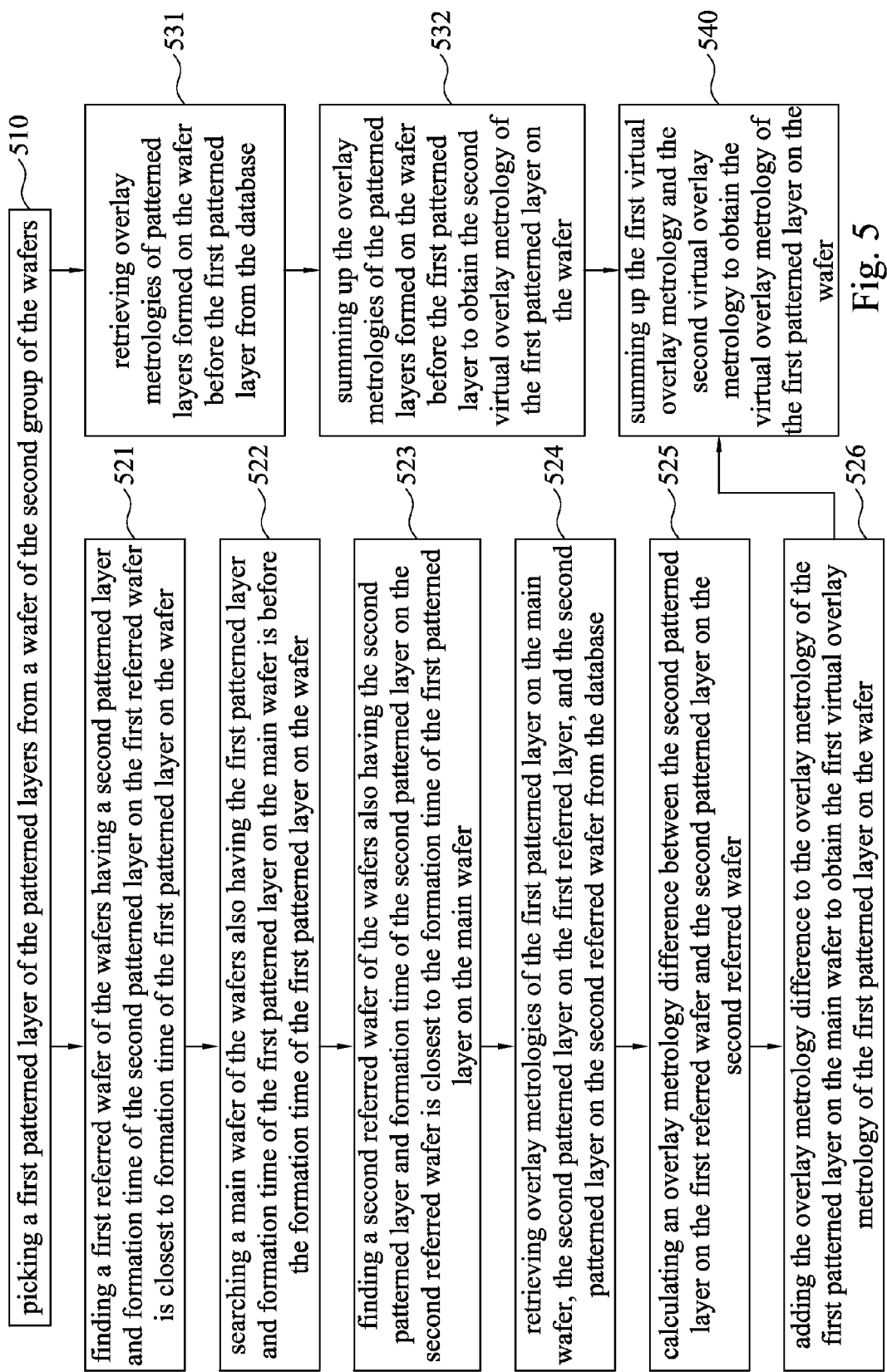
FIG. 5 is a process of measuring virtual overlay metrologies of a second group of wafers with some embodiments.

Operation 250 is applied to calculate the virtual overlay metrologies of the second group of the wafers, and referring to FIG. 3 and FIG. 5 to further clarify operation 250. FIG. 5 is a process of calculating the virtual overlay metrologies of the second group of the wafers, which begins with operation 510, a first patterned layer 312A of the patterned layers is picked from a wafer 310 of the second group of the wafers. In FIG. 3, the wafer 310 having the patterned layers, and virtual overlay metrology of the first patterned layer 312A is calculated in the virtual overlay metrology tool 150. The virtual overlay metrology of the first patterned layer 312A is combined by a first virtual overlay metrology and a second virtual overlay metrology, which are calculated with different mechanisms respectively.

Operation 521 to 525 are applied to calculate the first virtual overlay metrology of the first patterned layer 312A on the wafer 310. Referring to operation 521, a first referred wafer 320 of the wafers is found having a second patterned layer 322A and formation time of the second patterned layer 322A on the first referred wafer 320 is closest to formation time of the first patterned layer 312A on the wafer 310. Referring to FIG. 3, a different type of patterned layer with the first patterned layer 312A is formed on the first referred wafer 320 in the exposure tool 120, and time of forming the second patterned layer 322A on the first referred wafer 320 is closest to time of forming the first patterned layer 312A on the wafer 310.

Continuing to operation 522, a main wafer 330 of the wafers is searched having a first patterned layer 312B and formation time of the first patterned layer 312B on the main wafer 330 is before the formation time of the first patterned layer 312A on the wafer 310. Referring to FIG. 3, the first patterned layer 312B is a same type of patterned layer with the first patterned layer 312A, and time of forming the first patterned layer 312B on the main wafer 330 is before the time of forming the first patterned layer 312A on the wafer 310.

Referring to operation 523, a second referred wafer 340 of the wafers is found having the second patterned layer 322B and formation time of the second patterned layer 322B on the second referred wafer 340 is closest to the formation time of the first patterned layer 312B on the main wafer 330. Referring to FIG. 3, the second patterned layer 322B is a same type of patterned layer with the second patterned layer 322A, and time of forming the second patterned layer 322B on the second referred wafer 340 is closest to the time of forming the first patterned layer 312B on the main wafer 330.

In embodiments, the formation time of the first patterned layer 312B on the main wafer 330, the second patterned layer 322A on the first referred wafer 320, and the second patterned layer 322B on the second referred wafer 340 are before the formation time of the first patterned layer 312A on the wafer 310.

Continuing to operation 524, overlay metrologies of the first patterned layer 312B on the main wafer 330, the second patterned layer 322A on the first referred layer 320, and the second patterned layer 322B on the second referred wafer 340 are retrieved from the database 110. Because the formation time of the first patterned layer 312B, the second patterned layer 322A, and the second patterned layer 322B are before the formation time of the first patterned layer 312A, the overlay metrologies of these patterned layers are already stored to the database 110 as the historical overlay metrologies, which are retrievable for calculating the first virtual overlay metrology of the first patterned layer 312A on the wafer 310.

Referring to operation 525, an overlay metrology difference between the second patterned layer 322A on the first referred wafer 320 and the second patterned layer 322B on the second referred wafer 340 is calculated. The overlay metrology of the second patterned layer 322A and the second patterned layer 322B are retrieved by operation 524, and the overlay metrology difference is calculated and also known as an equipment calibration. The equipment calibration represents overlay metrology tendencies in the exposure tool 120, which helps accurately calculating the first virtual overlay metrology of the first patterned layer 312A on the wafer 310.

Continuing to operation 526, the overlay metrology difference is added to the overlay metrology of the first patterned layer 312B on the main wafer 330 to obtain the first virtual overlay metrology of the first patterned layer 312A on the wafer 310. The overlay metrology of the first patterned layer 312B is already known by operation 524, which is revised with the overlay metrology difference to obtain the first virtual overlay metrology of the first patterned layer 312A on the wafer 310. With considering the overlay metrology tendencies caused by the exposure tool 120 during processing, credibility of the first virtual overlay metrology of the first patterned layer 312A on the wafer 310 enhanced therefore.

On the other hand, the virtual overlay metrology tool 150 also calibrates a wafer-behavior of the wafer 310. During forming the first patterned layer 312A on the wafer 310 and the first patterned layer 312B on the main wafer 330 in the exposure tool 120, there exists variations between the wafer 310 and the main wafer 330, for example, wafer size, wafer displacement, and wafer rotation. Masks for forming the first patterned layers 312A and 312B are also different during process in the exposure tool 120, for example, mask size, mask displacement, and mask rotation.

These variations may cause deviations on calculating the virtual overlay metrologies, if neglecting these variations, the first virtual overlay metrology calculated above will bound to a disparity with the real overlay metrology. On the purpose to increase the reliability of the virtual overlay metrology, operation 531 and 532 are introduced to calibrate the characteristic variations between different wafers or between different masks.

As mentioned before, the wafer 310 having the patterned layers formed thereon. FIG. 6 shows an exploded view of the wafer 310. Before forming the first patterned layer 312A on the wafer 310 in the exposure tool 120, a third patterned layer 314 and a fourth patterned layer 316 are already formed on the wafer 310. The formation time of the third patterned layer 314 and the fourth patterned layer 316 are before the formation time of the first patterned layer 312A, and thus overlay metrologies of the third patterned layer 314 and the fourth patterned layer 316 are already stored to the database 110 as the historical overlay metrologies, which represent the characteristic of the wafer 310.

Referring to operation 531, overlay metrologies of patterned layers formed on the wafer 310 before the first patterned layer 312A are retrieved from the database 110. The third patterned layer 314 and the fourth patterned layer 316 are formed on the wafer 310 before the first patterned layer 312A, and the overlay metrologies of these patterned layers 314 and 316 are already stored to the database 110 and retrievable in operation 531.

Continuing to operation 532, the overlay metrologies of the patterned layers formed on the wafer 310 before the first patterned layer 312A are summed up to obtain the second virtual overlay metrology of the first patterned layer 312A on the wafer 310. The second virtual overlay metrology also known as a wafer-behavior calibration, the characteristics of misalignment from the third patterned layer 314 and the fourth patterned layer 316 will retain on the second virtual overlay metrology to further increasing the reliability of the virtual overlay metrology.

Referring to operation 540, the first virtual overlay metrology and the second virtual overlay metrology are summed up to obtain the virtual overlay metrology of the first patterned layer 312A on the wafer 310. With considering the exposure tool 120 behavior and the variations between the masks and the wafers, the virtual overlay metrologies will be predicted and partially replace the real overlay metrologies, and thus decreases the loading of the real overlay metrology tool 140.

In various embodiments, the first virtual overlay metrology and the second virtual overlay metrology are combined to obtain the virtual overlay metrology, in which the first virtual overlay metrology or the second virtual overlay metrology may be the above mechanism/algorithm or any process steps sufficient to accurately calculate the virtual overlay metrology and thus reduce the loading on the overlay metrology capacity.

The overlay recipe in the exposure tool 120 and the historical overlay metrologies in the database 110 are delivered and processed by the advanced process controller 160. The advanced process controller 160 determines the overlay parameters in the overlay recipe with the historical overlay metrologies and provides it to the exposure tool 120, which decreases misalignment between the patterned layers formed in the exposure tool 120.

Referring to FIG. 6 to further clarify a mechanism for decreasing misalignment between the patterned layers with the advanced process controller 160. As mentioned before, the fourth patterned layer 316 is already formed on the wafer 310 before the third patterned layer 314. After forming the third patterned layer 314 on the wafer 310, an overlay metrology of the third patterned layer 314 is known by the real overlay metrology measurement or the virtual overlay metrology calculation.

The overlay metrology of the third patterned layer 314 represents misalignment between the third patterned layer 314 and the fourth patterned layer 316. On the purpose to avoid misalignment between the first patterned layer 312A and the third patterned layer 314, the advanced process controller 160 is applied before forming the first patterned layer 312A on the wafer 310.

The misalignment will be calibrated by changing the overlay parameters in the overlay recipe from the exposure tool 120. The over recipe in the exposure tool 120 includes an inter-field parameter and an intra-field parameter. The inter-field parameter includes an x-translation wafer parameter, a y-translation wafer parameter, an x-expansion wafer parameter, a y-expansion wafer parameter, an x-rotation wafer parameter, and a y-rotation wafer parameter, and the intra-field parameter includes an x-translation field parameter, a y-translation field parameter, an x-expansion field parameter, a y-expansion field parameter, an x-rotation field parameter, and a y-rotation field parameter.

The advanced process controller 160 analyzes the overlay metrology of the third patterned layer 314 and determines values of the overlay parameters in the overlay recipe. The overlay recipe with new values of the overlay parameters will return back to the exposure tool 120 and forming the first patterned layer 312A on the wafer 310 with reduced misalignment.

The embodiments of the present disclosure discussed above have advantages over existing processes, and the advantages are summarized below. In various embodiments, the virtual overlay metrologies will partially replace the real overlay metrologies, and the loading of the real overlay metrology tool 140 decreases significantly. The equipment calibration and the wafer-behavior calibration are applied to calculate the virtual overlay metrology, which decrease disparity between the real overlay metrology measurement and the virtual overlay metrology calculation and enhance reliability of the virtual overlay metrology.

On the other hand, the real overlay metrologies and the virtual overlay metrologies are stored to the database 110 and retrievable as feedback information to augment a run-to-run control capability. With the virtual overlay metrology calculation, the advanced process controller 160 obtained overlay conditions of the wafers quickly and responses to change the overlay recipe immediately, and thus reduces misalignment between pattered layers on the wafers. Summarize above points, application of the virtual overlay metrology calculation reduces the loading of the real overlay metrology tool 140 and decreases the misalignment between patterned layers.

In accordance with some embodiments, the present disclosure discloses a process of measuring overlay metrologies of wafers, each of the wafers having a plurality of patterned layers. The process begins with retrieving historical overlay metrologies from a database, and real overlay metrologies of a first group of the wafers are measured. On the other hand, virtual overlay metrologies of a second group of the wafers are calculated with the retrieved historical overly metrologies. The real overlay metrologies of the first group of the wafers and the virtual overlay metrologies of the second group of the wafers are stored to the database as the historical overlay metrologies.

In accordance with some embodiments, the present disclosure discloses a wafer overlay metrology measurement apparatus. The wafer overlay metrology measurement apparatus includes a database storing historical overlay metrologies, an overlay metrology tool configured to retrieve the historical overlay metrologies from the database and measuring overlay metrologies of wafers. The overlay metrology tool includes a real overlay metrology tool and a virtual overlay metrology tool configured to retrieve the historical overlay metrologies.

In accordance with some embodiments, the present disclosure discloses a process of forming a plurality of patterned layers on wafers. The process begins with retrieving historical overlay metrologies in a database and an overlay recipe in an exposure tool to an advanced process controller. The advanced process controller determines overlay parameters in the overlay recipe and returns the overlay recipe to the exposure tool to form the patterned layers on the wafers with the overlay recipe. Real overlay metrologies of a first group of the wafers are measured. On the other hand, virtual overlay metrologies of a second group of the wafers are calculated, which begins with picking a first patterned layer from a wafer of the second group of the wafers, and finding a first referred wafer of the wafers having a second patterned layer and formation time of the second patterned layer on the first referred wafer is closest to formation time of the first patterned layer on the wafer. Then searching a main wafer of the wafers having the first patterned layer and formation time of the first patterned layer on the main wafer is before the formation time of the first patterned layer on the wafer, and finding a second referred wafer of the wafers having the second patterned layer and formation time of the second patterned layer on the second referred wafer is closest to the formation time of the first patterned layer on the main wafer. Retrieving overlay metrologies of the first patterned layer on the main wafer, the second patterned layer on the first referred layer, and the second patterned layer on the second referred wafer from the database and calculating an overlay metrology difference between the second patterned layer on the first referred wafer and the second patterned layer on the second referred wafer. On the other hand, retrieving overlay metrologies of patterned layers formed on the wafer before the first patterned layer from the database, and summing up the overlay metrology difference, the overlay metrology of the first patterned layer on the main wafer, and the overlay metrologies of the patterned layers formed on the wafer before the first patterned layer to obtain the virtual overlay metrology of the first patterned layer on the wafer. The real overlay metrologies and the virtual overlay metrologies of the wafers are stored to the database.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A process of measuring overlay metrologies of wafers, each of the wafers having a plurality of patterned layers, the process comprising:
    retrieving historical overlay metrologies from a database by a virtual overlay metrology tool;
    measuring real overlay metrologies of a first group of the wafers by a real overlay metrology tool;
    calculating virtual overlay metrologies of a second group of the wafers with the retrieved historical overlay metrologies by the virtual overlay metrology tool; and
    storing the real overlay metrologies and the virtual overlay metrologies of the wafers to the database as the historical overlay metrologies, the storing step being executed by the virtual overlay metrology tool and the real overlay metrology tool.

2. The process of claim 1, wherein the patterned layers are formed on the wafers in an exposure tool with an overlay recipe.

3. The process of claim 1, wherein the patterned layers are different from each other on the wafer.

4. The process of claim 1, wherein the overlay metrologies of the patterned layers on each of the wafers are stored to the database as the historical overlay metrologies.

5. The process of claim 1, wherein measuring the real overlay metrologies of the first group of the wafers by the real overlay metrology tool comprises:
    providing a plurality of fields over a wafer surface of the first group of the wafers, wherein the fields include inner fields in a central region of the wafer surface and outer fields near a circumferential edge of the wafer surface;
    measuring a first number of overlay conditions at a corresponding first number of overlay structures on the inner field;
    measuring a second number of overlay conditions at a corresponding second number of overlay structures on the outer field, the second number being greater than the first number; and determining a real overlay metrology of a patterned layer of the patterned layers on the wafer based on the measured first number of overlay conditions and the measured second number of overlay conditions.

6. The process of claim 1, wherein calculating the virtual overlay metrologies of the second group of the wafers by the virtual overlay metrology tool comprises:
  picking a first patterned layer from a wafer of the second group of the wafers;
  calculating a first virtual overlay metrology and a second virtual overlay metrology of the first patterned layer on the wafer with the historical overlay metrologies by the virtual overlay metrology tool; and
  summing up the first virtual overlay metrology and the second virtual overlay metrology to obtain virtual overlay metrology of the first patterned layer on the wafer.

7. The process of claim 6, wherein calculating the first virtual overlay metrology of the first patterned layer on the wafer by the virtual overlay metrology tool comprises:
  finding a first referred wafer of the wafers having a second patterned layer and formation time of the second patterned layer on the first referred wafer is closest to formation time of the first patterned layer on the wafer;
  searching a main wafer of the wafers having the first patterned layer and formation time of the first patterned layer on the main wafer is before the formation time of the first patterned layer on the wafer;
  finding a second referred wafer of the wafers having the second patterned layer and formation time of the second patterned layer on the second referred wafer is closest to the formation time of the first patterned layer on the main wafer;
  retrieving overlay metrologies of the first patterned layer on the main wafer, the second patterned layer on the first referred wafer, and the second patterned layer on the second referred wafer from the database;
  calculating an overlay metrology difference between the second patterned layer on the first referred wafer and the second patterned layer on the second referred wafer; and
  adding the overlay metrology difference to an overlay metrology of the first patterned layer on the main wafer to obtain the first virtual overlay metrology of the first patterned layer on the wafer.

8. The process of claim 7, wherein the formation time of the first patterned layer on the main wafer, the second patterned layer on the first referred wafer, and the second patterned layer on the second referred wafer are before the formation time of the first patterned layer on the wafer.

9. The process of claim 7, wherein calculating the second virtual overlay metrology of the first patterned layer on the wafer by the virtual overlay metrology tool comprises:
  retrieving overlay metrologies of patterned layers formed on the wafer before the first patterned layer from the database; and
  summing up the overlay metrologies of the patterned layers formed on the wafer before the first patterned layer to obtain the second virtual overlay metrology of the first patterned layer on the wafer.

10. The process of claim 2, wherein the overlay recipe in the exposure tool and the historical overlay metrologies in the database are processed by an advanced process controller.

11. The process of claim 10, wherein the advanced process controller determines overlay parameters in the overlay recipe with the historical overlay metrologies and provides the overlay recipe back to the exposure tool.

12. A wafer overlay metrology measurement apparatus comprising:
  a database storing historical overlay metrologies, wherein the historical overlay metrologies comprises real overlay metrologies and virtual overlay metrologies; and
  an overlay metrology tool configured to retrieve the historical overlay metrologies from the database and measuring overlay metrologies of wafers, the overlay metrology tool comprising:
  a real overlay metrology tool; and
  a virtual overlay metrology tool configured to retrieve the historical overlay metrologies.

13. The apparatus of claim 12, wherein the virtual overlay metrology tool calculates virtual overlay metrologies with the retrieved historical overlay metrologies by:
  picking a first patterned layer from a wafer;
  finding a first referred wafer of the wafers having a second patterned layer and formation time of the second patterned layer on the first referred wafer is closest to formation time of the first patterned layer on the wafer;
  searching a main wafer of the wafers having the first patterned layer and formation time of the first patterned layer on the main wafer is before the formation time of the first patterned layer on the wafer;
  finding a second referred wafer of the wafers having the second patterned layer and formation time of the second patterned layer on the second referred wafer is closest to the formation time of the first patterned layer on the main wafer;
  retrieving overlay metrologies of the first patterned layer on the main wafer, the second patterned layer on the first referred layer, and the second patterned layer on the second referred wafer from the database;
  calculating an overlay metrology difference between the second patterned layer on the first referred wafer and the second patterned layer on the second referred wafer;
  retrieving overlay metrologies of patterned layers formed on the wafer before the first patterned layer from the database; and
  summing up the overlay metrology difference, the overlay metrology of the first patterned layer on the main wafer, and the overlay metrologies of the patterned layers formed on the wafer before the first patterned layer to obtain the virtual overlay metrology of the first patterned layer on the wafer.

14. The apparatus of claim 12, further comprising an exposure tool configured to form patterned layers on the wafers with an overlay recipe.

15. The apparatus of claim 14, further comprising an advanced process controller configured to retrieve the overlay recipe from the exposure tool and the historical overlay metrologies from the database, wherein the advanced process controller revises the overlay recipe with the retrieved historical overlay metrologies.

16. A process of forming a plurality of patterned layers on wafers, the process comprising:
  providing historical overlay metrologies from a database and an overlay recipe to an advanced process controller;
  determining overlay parameters in the overlay recipe with the historical overlay metrologies;
  returning the overlay recipe and forming the patterned layers on the wafers with the overlay recipe;
  measuring real overlay metrologies of a first group of the wafers;
  calculating virtual overlay metrologies of a second group of the wafers, comprising:
  picking a first patterned layer from a wafer of the second group of the wafers;

finding a first referred wafer of the wafers having a second patterned layer and formation time of the second patterned layer on the first referred wafer is closest to formation time of the first patterned layer on the wafer;

searching a main wafer of the wafers having the first patterned layer and formation time of the first patterned layer on the main wafer is before the formation time of the first patterned layer on the wafer;

finding a second referred wafer of the wafers having the second patterned layer and formation time of the second patterned layer on the second referred wafer is closest to the formation time of the first patterned layer on the main wafer;

retrieving overlay metrologies of the first patterned layer on the main wafer, the second patterned layer on the first referred layer, and the second patterned layer on the second referred wafer from the database;

calculating an overlay metrology difference between the second patterned layer on the first referred wafer and the second patterned layer on the second referred wafer;

retrieving overlay metrologies of patterned layers formed on the wafer before the first patterned layer from the database; and summing up the overlay metrology difference, the overlay metrology of the first patterned layer on the main wafer, and the overlay metrologies of the patterned layers formed on the wafer before the first patterned layer to obtain the virtual overlay metrology of the first patterned layer on the wafer; and storing the real overlay metrologies and the virtual overlay metrologies of the wafers to the database.

17. The process of claim 16, wherein measuring the real overlay metrologies of the first group of the wafers comprises:

providing a plurality of fields over a wafer surface of the first group of the wafers, wherein the fields include inner fields in a central region of the wafer surface and outer fields near a circumferential edge of the wafer surface;

measuring a first number of overlay conditions at a corresponding first number of overlay structures on the inner field;

measuring a second number of overlay conditions at a corresponding second number of overlay structures on the outer field, the second number being greater than the first number; and determining a real overlay metrology of a patterned layer of the patterned layers on the wafer based on the measured first number of overlay conditions and the measured second number of overlay conditions.

18. The process of claim 16, wherein the overlay recipe comprises an inter-field parameter and an intra-field parameter.

19. The process of claim 18, wherein the inter-field parameter comprises an x-translation wafer parameter, a y-translation wafer parameter, an x-expansion wafer parameter, a y-expansion wafer parameter, an x-rotation wafer parameter, and a y-rotation wafer parameter.

20. The process of claim 18, wherein the intra-field parameter comprises an x-translation field parameter, a y-translation field parameter, an x-expansion field parameter, a y-expansion field parameter, an x-rotation field parameter, and a y-rotation field parameter.

* * * * *